(12) United States Patent
Zhao (10) Patent No.: US 9,305,823 B2
(45) Date of Patent: Apr. 5, 2016

(54) SEMICONDUCTOR DEVICE INCLUDING STI STRUCTURE AND FABRICATION METHOD (71) Applicant: Semiconductor Manufacturing International (Shanghai) Corporation, Shanghai (CN)

(72) Inventor: Meng Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 28 days.

(21) Appl. No.: 14/207,678

(22) Filed: Mar. 13, 2014

(65) Prior Publication Data
US 2014/0291799 A1 Oct. 2, 2014

(30) Foreign Application Priority Data
Apr. 2, 2013 (CN) .......................... 2013 1 0113662

(51) Int. Cl.
H01L 21/762 (2006.01)
H01L 29/10 (2006.01)

(52) U.S. Cl.
CPC .... H01L 21/76224 (2013.01); H01L 21/76232 (2013.01); H01L 29/1033 (2013.01)

(58) Field of Classification Search
USPC .......................................................... 438/429
See application file for complete search history.

(56) References Cited

U.S. PATENT DOCUMENTS

| 6,875,279 B2* | 4/2005 | Chu ..................... C23C 16/4412 117/200 |
| 2006/0154435 A1* | 7/2006 | Lee ................... H01L 21/76232 438/396 |
| 2013/0099281 A1* | 4/2013 | Yu ....................... H01L 29/6659 257/190 |
| 2014/0231923 A1* | 8/2014 | Yin ................... H01L 29/66545 257/369 |

* cited by examiner

Primary Examiner — Stephen W Smoot
(74) Attorney, Agent, or Firm — Anova Law Group, PLLC (57) ABSTRACT Semiconductor devices including STI structures and their fabrication methods are provided. A mask layer is provided on a semiconductor substrate and patterned to form an opening in the mask layer to expose a surface portion of the semiconductor substrate. A trench is then formed in the semiconductor substrate by etching along the opening. A first dielectric layer is formed in the trench and has a top surface lower than a top surface of the semiconductor substrate to provide an uncovered sidewall surface of the trench in the semiconductor substrate. An epitaxial layer is formed on the uncovered sidewall surface of the trench in the semiconductor substrate. The epitaxial layer includes a spacing to expose a surface portion of the first dielectric layer. A second dielectric layer is formed on the exposed surface portion of the first dielectric layer to fill the spacing formed in the epitaxial layer.

16 Claims, 6 Drawing Sheets

FIG. 1

*(Prior Art)*

FIG. 2

*(Prior Art)*

SEMICONDUCTOR DEVICE INCLUDING STI STRUCTURE AND FABRICATION METHOD

CROSS-REFERENCES TO RELATED APPLICATIONS

This application claims priority to Chinese Patent Application No. CN201310113662.5, filed on Apr. 2, 2013, the entire contents of which are incorporated herein by reference.

FIELD OF THE INVENTION

The present disclosure generally relates to the field of semiconductor manufacturing technology and, more particularly, relates to semiconductor devices including shallow trench isolation (STI) structures and methods for making the same.

BACKGROUND

With advances of semiconductor process technology and decreasing of process node, critical dimensions (CDs) of semiconductor devices are further reduced and channel widths of field-effect transistors (FETs) keep narrowing down. This may result in narrow channel effect to cause reduction of drive current of the FETs. Multi-gate devices such as Fin FETs are conventionally used to increase the channel width and thus to increase the drive current. However, the fabrication process of such multi-gate devices is complex and with high cost.

Figure 1:
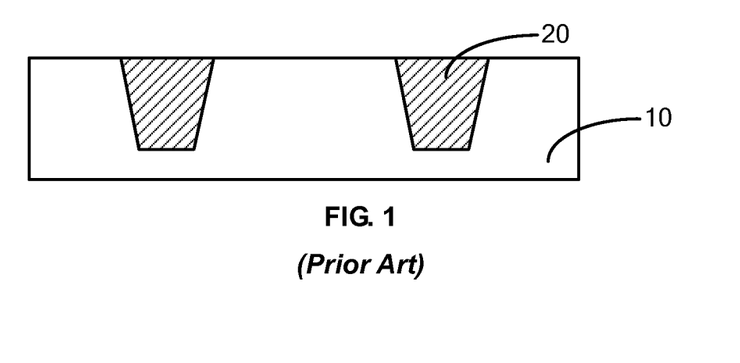
FIG. 1 is a schematic illustrating a conventional STI structure.

In a conventional integrated circuit (IC) fabrication process, shallow trench isolation (STI) structures are widely used as lateral isolation structures between semiconductor devices. FIG. 1 is a schematic illustrating a conventional STI structure. As shown, the fabrication process of the conventional STI structure 20 includes forming shallow trenches in a semiconductor substrate 10 by a dry etch process to isolate active regions in the semiconductor substrate, and forming a dielectric material layer inside the shallow trenches to completely fill the shallow trenches and cover the surface of the semiconductor substrate 10. The dielectric material layer is made of silicon oxide. The dielectric material layer may be planarized by a chemical mechanical polishing (CMP) technique to form the shallow trench structure 20.

Figure 2:
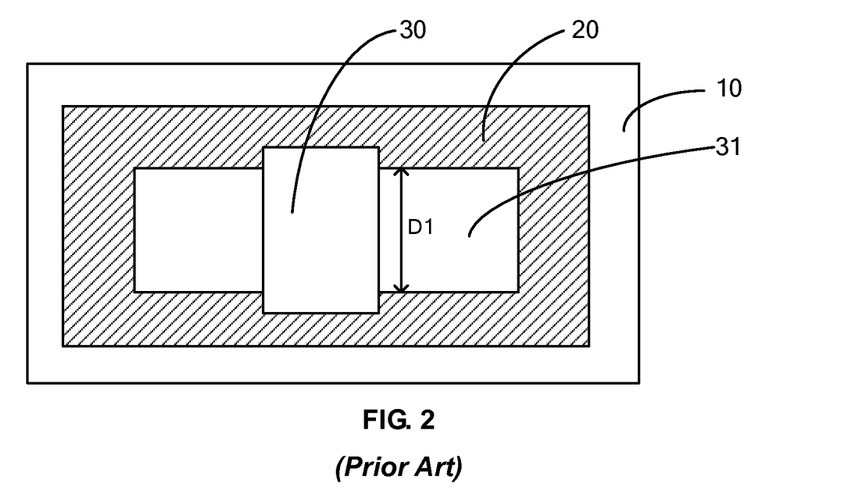
FIG. 2 is a schematic illustrating a top view of a semiconductor substrate including a transistor formed between neighboring STI structures by a conventional technology.

FIG. 2 is a schematic illustrating a top view of the semiconductor substrate 10 after forming a transistor between STI structures. The transistor includes a gate 30 and source/drain 31 positioned on each side of the gate 30. The channel width of the transistor is shown as width D1 of the semiconductor substrate 10 under the gate 30.

As integration degree of the ICs is increasingly enhanced, the width D1 of the semiconductor substrate between neighboring STI structures or the channel width of the transistor decreases. The decrease of the channel width may cause reduction of the drive current of the transistor.

BRIEF SUMMARY OF THE DISCLOSURE

An aspect of the present disclosure includes a method for forming a semiconductor device. A mask layer is provided on a semiconductor substrate and patterned to form an opening in the mask layer to expose a surface portion of the semiconductor substrate. A trench is then formed in the semiconductor substrate by etching along the opening. A first dielectric layer is formed in the trench and has a top surface lower than a top surface of the semiconductor substrate to provide an uncovered sidewall surface of the trench in the semiconductor substrate. An epitaxial layer is formed on the uncovered sidewall surface of the trench in the semiconductor substrate and on the first dielectric layer. The epitaxial layer includes a spacing to expose a surface portion of the first dielectric layer. A second dielectric layer is formed on the exposed surface portion of the first dielectric layer to fill the spacing formed in the epitaxial layer.

Another aspect of the present disclosure includes a semiconductor device. The semiconductor device includes a semiconductor substrate; and a plurality of shallow trench isolation (STI) structures disposed in the semiconductor substrate. Each STI structure includes: a first dielectric layer, an epitaxial layer, and a second dielectric layer. The first dielectric layer is disposed in a trench in the semiconductor substrate and having a top surface lower than a top surface of the semiconductor substrate to provide an uncovered sidewall surface of the trench in the semiconductor substrate. The epitaxial layer is disposed on the uncovered sidewall surface of the trench in the semiconductor substrate and on a surface portion of the first dielectric layer. The epitaxial layer has a top surface leveled with the top surface of the semiconductor substrate. The second dielectric layer is disposed on a remaining surface portion of the first dielectric layer. The second dielectric layer has a top surface leveled with the top surface of the semiconductor substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As integration degree of ICs is increasingly enhanced, width (e.g., D1 shown in FIG. 2) of semiconductor substrate between neighboring shallow trench isolation (STI) structures or channel width of formed transistor decreases. The decrease of the channel width may cause reduction of the drive current of the transistor. Although a multi-gate transistor can be employed to increase channel width of the transistor, the manufacturing process is a complex with high cost. Therefore, increasing a width of active region between neighboring STI structures can be an effective way to enhance the channel width of transistor formed in the active region. Methods for increasing a width of an active region may include increasing a distance between adjacent STI structures, which, however, decreases the integration degree of ICs and increases the chip area.

Disclosed herein includes a semiconductor device having STI structures and a method of making the same. The disclosed semiconductor device and fabrication method can improve width of active region between adjacent STI structures without decreasing or scarifying the integration degree of ICs.

Figure 16:
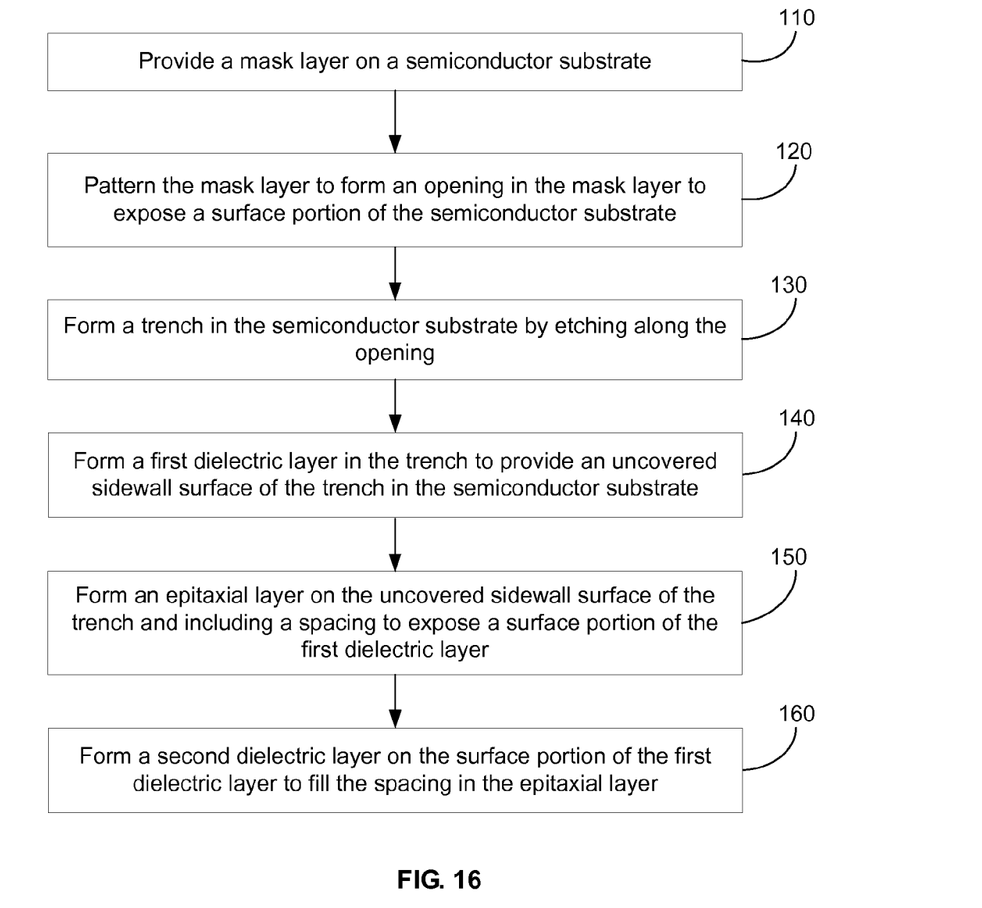
FIG. 16 depicts an exemplary method for forming a semiconductor device including a STI structure consistent with the disclosed embodiments.

FIGS. 3-14 depict an exemplary STI structure at various stages during its formation; while FIG. 16 depicts an exemplary method for forming a semiconductor device consistent with the disclosed embodiments.

Figure 3:
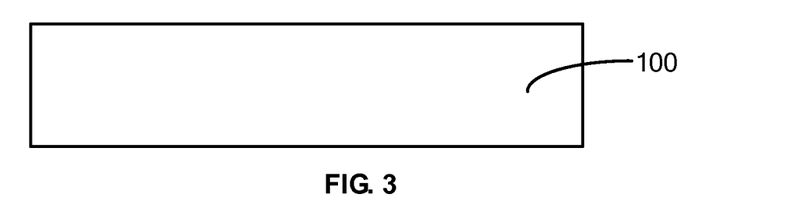
FIGS. 3-14 depict an exemplary semiconductor device including a STI structure at various stages during its formation consistent with the disclosed embodiments.

Referring to FIG. 3, a semiconductor substrate 100 is provided. The semiconductor substrate 100 can be made of a material including, e.g., silicon, germanium, silicon germanium, gallium arsenide, or other suitable materials. The semiconductor substrate 100 can be a bulk material or a composite including, e.g., silicon-on-insulator (SOI). The type of semiconductor substrate 100 can be determined based on semiconductor devices to be formed on the semiconductor substrate 100, thus the type of semiconductor substrate is not limited according to various disclosed embodiments. In an exemplary embodiment, the semiconductor substrate is made of silicon.

Figure 4:
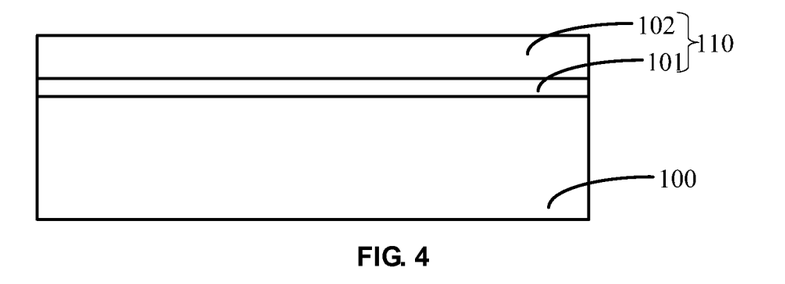

Referring to FIG. 4, a mask layer 110 is formed on surface of the semiconductor substrate 100 (e.g., Step 110 of FIG. 16). The mask layer 110 can include a pad oxide layer 101 formed on the surface of the semiconductor substrate 100 and a silicon nitride layer 102 formed on surface of the pad oxide layer 101.

The pad oxide layer 101 can be made of, e.g., silicon oxide, and can act as a buffer layer for the subsequently-formed silicon nitride layer 102. When the silicon nitride layer 102 is directly deposited on the semiconductor substrate, dislocation defects can be created on the surface of semiconductor substrate due to a higher stress. When the pad oxide layer 101 is formed between the semiconductor substrate 100 and the silicon nitride layer 102, the dislocation defects resulted from direct deposition of the silicon nitride layer 102 on the semiconductor substrate 100 can be avoided.

Further, the pad oxide layer 101 can be used as an etch stop layer for a subsequent etching of the silicon nitride layer 102. In one embodiment, the pad oxidation layer 101 can be formed by, e.g., a thermal oxidation process and the silicon nitride layer 102 can be deposited by, e.g., a chemical vapor deposition process.

Figure 5:
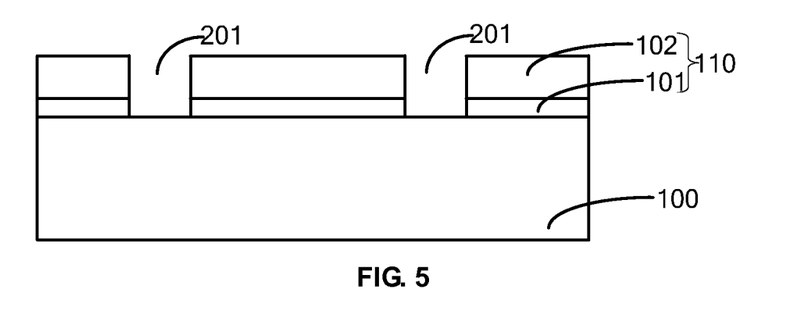

Referring to FIG. 5, the mask layer 110 is patterned and an opening 201 is formed in the mask layer 110 to expose a surface portion of the semiconductor substrate 100 (e.g., Step 120 of FIG. 16). A dry etching process is employed to form the opening 201. For example, a photoresist pattern (not shown) corresponding to the opening 201 can be formed on surface of the silicon nitride layer 102. The silicon nitride layer 102 and the pad oxide layer 101 can then be etched in sequence by a dry etching process using the photoresist pattern as an etch mask until forming the opening 201 to expose the semiconductor substrate. The photoresist pattern can then be removed after the formation of opening 201, e.g., by an ashing process or a chemical reagent removal process. In an exemplary embodiment, the dry etching process includes a plasma etching process.

The opening 201 has a width ranging from about 5 nm to about 100 nm and defines a position of the subsequently formed STI structure. A distance between neighboring openings 201 and the width of the opening 201 can be controlled or adjusted according to an integration degree/level of actual circuits and according to a density distribution of ICs.

Figure 6:
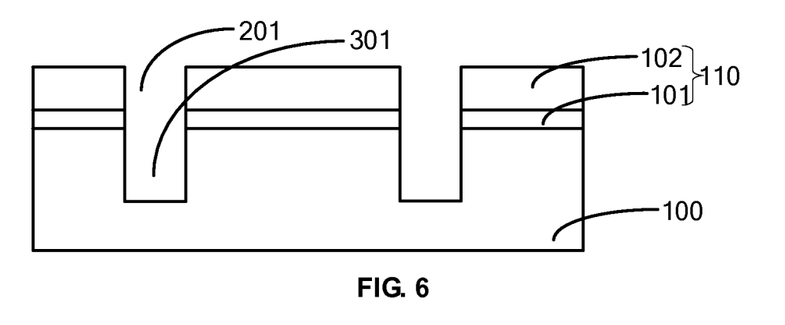

Referring to FIG. 6, a trench 301 is formed by etching the semiconductor substrate 100 along the opening 201 (e.g., Step 130 of FIG. 16). Specifically, a dry etching process can be employed using the patterned mask layer 110 as an etch mask to etch the semiconductor substrate 100 along the opening 201 to form the trench 301.

In an exemplary embodiment, a plasma etching process can be used to etch the semiconductor substrate 100. The depth of the trench 301 can range from about 10 nm to about 200 nm. An STI structure can be formed by filling subsequently the trench 301 with a dielectric material.

In an exemplary embodiment, the trench 301 can be U-shaped. In other embodiments, the trench 301 can be a trench with inclined sidewalls having, e.g., a V-shaped trench, formed due to a faster etching rate at the top of trench compared with at the bottom of the trench.

Figure 7:
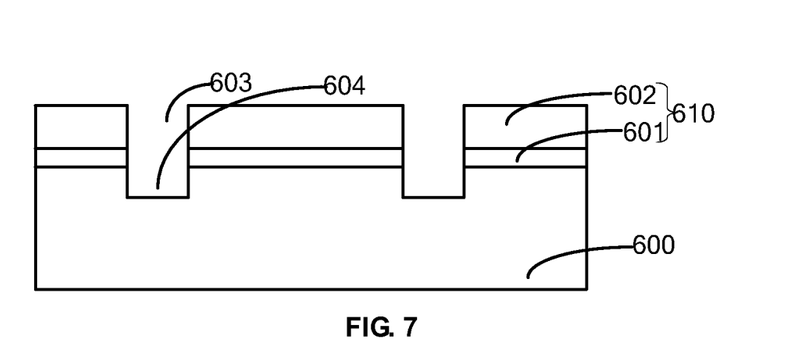

In various embodiments, the trench can be $\Sigma$-shaped. Specifically, a combined process of wet etching and dry etching can be used to form the $\Sigma$-shaped trench. For example, a first trench 604 can be formed by etching the semiconductor substrate 600 with a dry etching process (e.g. a plasma etching process), as shown in FIG. 7. The $\Sigma$-shaped trench 605 can then be formed by etching the semiconductor substrate 600 along the first trench 604 using a wet etching process, as shown in FIG. 8 (e.g., Step 130 of FIG. 16).

Figure 8:
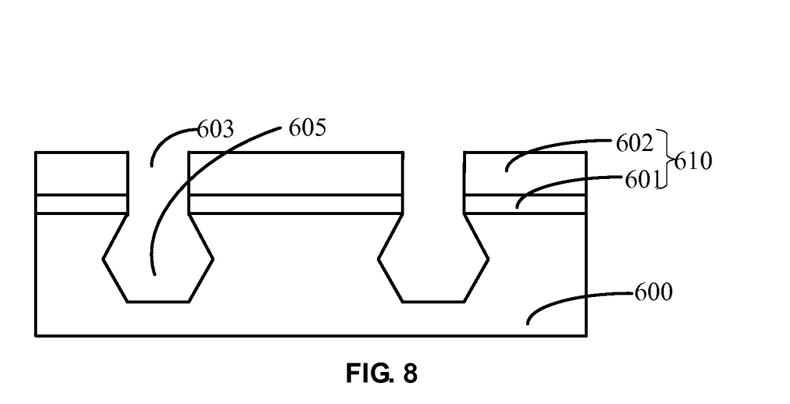

For the wet etching process shown in FIG. 8, a KOH solution can be used to etch the semiconductor substrate. KOH solution provides different etching rates in different crystal directions of silicon. $\Sigma$-shaped trench can thus be formed by using a silicon substrate having (100) crystal plane. In other embodiments, other wet etching process or dry etching process can be used to form desired $\Sigma$-shaped trench.

For an STI structure based on a $\Sigma$-shaped trench, the $\Sigma$-shaped STI structure is wider in the middle section of the STI structure. This can increase a distance between: source/drain on one side of the STI structure and a portion of the semiconductor substrate under the STI structure. Isolation effect between neighboring semiconductor devices can be improved.

Figure 9:
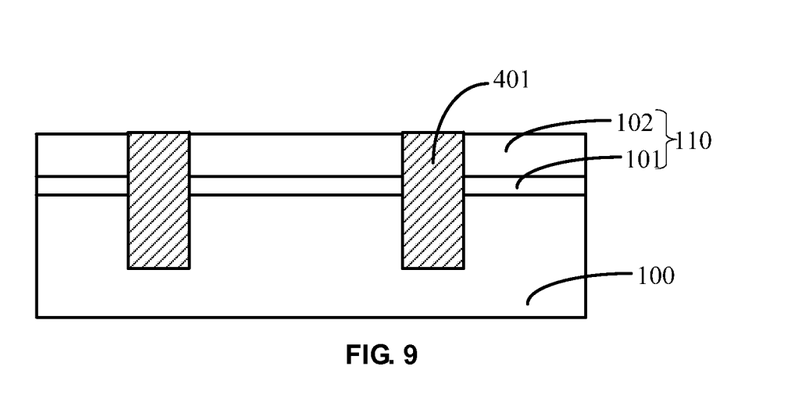

Referring to FIG. 9, in an exemplary embodiment, a dielectric material layer 401 is deposited on the semiconductor substrate 100 to completely fill the trench 301 and the opening 201 (referring to FIG. 6).

The dielectric material layer can be made of silicon oxide, silicon oxynitride, or high-k dielectric materials. In an exemplary embodiment, the dielectric material layer 401 is made of silicon oxide.

For example, the dielectric material can fill completely the trench 301 and the opening 201 and can cover the surface of the silicon nitride layer 102 by a chemical vapor deposition process. A chemical mechanical polishing process can be performed using the silicon nitride layer 102 as a stop layer to form the dielectric material layer 401 having a surface flushed with a top surface of the silicon nitride layer 102.

In other embodiments, a protective oxide layer may be formed on inner wall surface of the trench 301 prior to forming the dielectric material layer 401. In the case when the dielectric material directly fills the trench 301, voids may be formed between the dielectric material and the trench 301, due to poor adhesion between the dielectric material and silicon material on the sidewall of the trench 301. However, the desired adhesion between the protective oxide layer and the dielectric material layer can prevent formation of voids. Further, high stress can be resulted from mismatched materials between the dielectric material layer 401 and the silicon material on the sidewall of the trench. This high stress can also be avoided because of formation of the protective oxide layer. Additionally, the protective oxide layer can repair the damage occurred to the sidewall surface of the trench caused during the formation of trench by etching the semiconductor substrate. The isolation effect of the subsequently formed STI structure can further be enhanced. In one embodiment, the protective oxide layer can be deposited by a chemical vapor deposition process.

Figure 10:
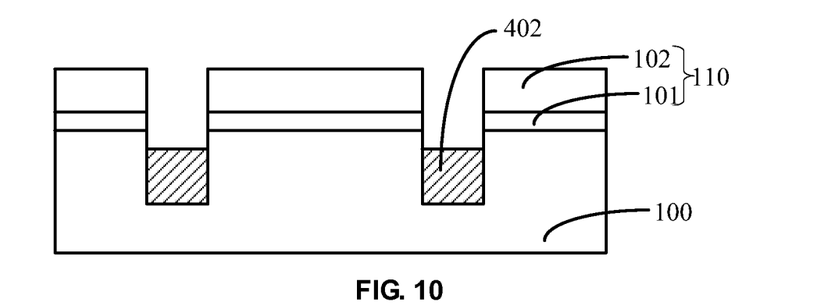

Referring to FIG. 10, the dielectric material layer 401 (as shown in FIG. 9) is etched back to form a first dielectric layer 402 having a top surface lower than a top surface of the semiconductor substrate 100 (e.g., Step 140 of FIG. 16).

A wet etching process can be utilized to etch back the dielectric material layer 401 to form the first dielectric layer 402. The first dielectric layer 402 can have a surface of about 5 nm to about 20 nm lower than the top surface of the semiconductor substrate. In other embodiments, a dry etching process can be used to etch back the dielectric material layer to form the first dielectric layer.

A sidewall portion (formed by the semiconductor substrate) of both sides of the trench 301 can be exposed above the top surface of the first dielectric layer 402, because the top surface of the first dielectric layer 402 is lower than the top surface of the semiconductor substrate 100. An epitaxial layer is subsequently formed by epitaxial growth on the exposed sidewall above the top surface of the first dielectric layer 402.

A height difference between the top surface of the first dielectric layer 402 and the top surface of semiconductor substrate 100 can be small, e.g., ranging from about 5 nm to about 20 nm. Accordingly the exposed sidewall of the trench 301 in the semiconductor substrate can have a height ranging from about 5 nm to about 20 nm. Because the exposed sidewall height can be small, the rate of epitaxial growth can be readily controlled to control the width of subsequently formed epitaxial layer.

In other embodiments, the first dielectric layer having a top surface lower than the top surface of the semiconductor substrate may be formed directly by a chemical vapor deposition process. Process parameters can be controlled to control the deposition thickness of dielectric material layer.

Figure 11:
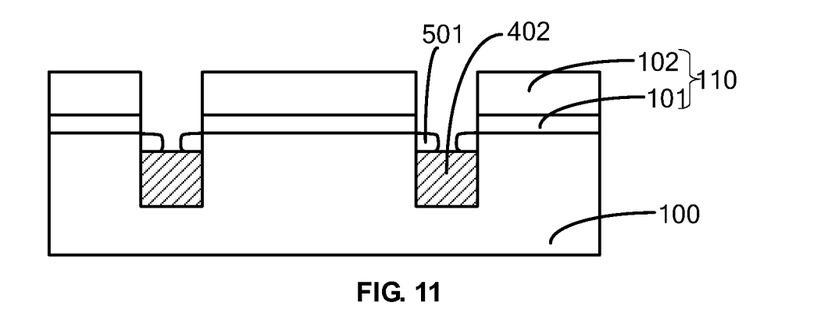

Referring to FIG. 11, an epitaxial layer 501 is formed on the sidewall of the trench 301 in the semiconductor substrate that is not covered by the first dielectric layer 402 (e.g., Step 150 of FIG. 16). Further, the epitaxial layer 501 includes a spacing between portions of the epitaxial layer 501 on both sidewalls of the trench 301. The spacing formed between portions of the epitaxial layer 501 exposes a surface portion of the first dielectric layer 402.

In an exemplary embodiment, an epitaxial growth process is employed to form the epitaxial layer 501, e.g., at a temperature for the epitaxial growth process ranging from about 700° C. to about 800° C. for an epitaxial duration ranging from about 20 min to about 40 min. The epitaxial layer can be made of a same material as the semiconductor substrate 100. The epitaxial layer can be made of silicon in an exemplary embodiment.

In other embodiments, an in-situ doping process can be employed to dope the epitaxial layer 501 with one or more ions selected from Ge, Xe, In, or As. The doped ions in the epitaxial layer 501 can have a concentration ranging from about $5E16$ atom/$cm^{-3}$ to about $5E18$ atom/$cm^{-3}$. The doped ions can increase the stress of active regions between neighboring STI structures and adjust electrical resistance and band width of the epitaxial layer, thus to improve the current performance of the semiconductor devices to be formed on surface of the active region.

The epitaxial layer 501 grows in the direction: along a surface of the semiconductor substrate 100 of the uncovered sidewall surface of the trench 301 (referring to FIG. 6) and along the top surface of the first dielectric layer 402, until gradually covering a surface portion of the first dielectric layer 402. The epitaxial layer 501 can be formed to increase the width of active region between neighboring STI structures.

The top surface of the first dielectric layer 402 may not be too much lower than the top surface of semiconductor substrate 100. For example, when the height difference between the top surface of first dielectric layer 402 and the top surface of semiconductor substrate 100 is overly high, then a large portion of sidewall surface of the trench 301 can be exposed, which allows a fast epitaxial growth rate when forming the epitaxial layer 501 by a chemical vapor deposition process. Such growth process is thus difficult control. That is, in a short period of time, the epitaxial layer 501 can cover completely the entire top surface of first dielectric layer 402, resulting in the interconnection of active regions of neighboring transistors formed on surface of the semiconductor substrate 100. In other words, the STI structure cannot isolate neighboring transistors.

In an exemplary embodiment, the top surface of first dielectric layer 402 is about 5 nm to about 20 nm lower than the top surface of semiconductor substrate 100, such that the epitaxial process for forming the epitaxial layer 501 can be precisely controlled as desired. The spacing or a distance formed between portions of the epitaxial layer 501 on the surface of both sidewalls of the trench 301 in the semiconductor substrate can be established by controlling the epitaxial growth time to expose a surface portion of the first dielectric layer 402. Such spacing between portions of the epitaxial layer 501 on both sidewalls of the trench 301 in the semiconductor substrate can subsequently be filled with dielectric material to form the STI structure.

Figure 12:
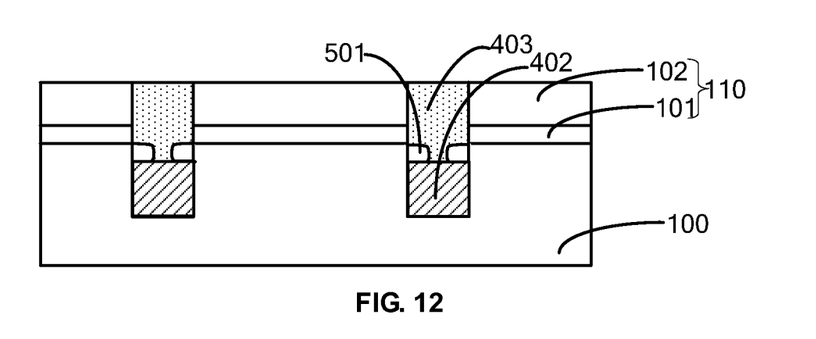

As shown in FIG. 12, a second dielectric material layer 403 is formed to completely fill the opening 201 (referring to FIG. 6) and the spacing in the remaining trench 301 (e.g., Step 160 of FIG. 16), with a dielectric material, such that the second dielectric material layer 403 has a top surface leveled with the top surface of silicon nitride layer 102.

For example, a chemical vapor deposition process can be used to completely fill the opening 201 and the spacing in the remaining trench 301 with the dielectric material. The dielectric material can then be polished by a planarization process using the silicon nitride layer 102 as a polishing stop layer to form the second dielectric material layer 403 having a top surface leveled with the top surface of the silicon nitride layer 102.

The second dielectric material layer 403 can isolate neighboring epitaxial layer 501. The second dielectric material layer 403 can be made of any insulator material(s) including, e.g., silicon oxide, silicon oxynitride, and/or high-k dielectric material. The second dielectric material layer 403 can be made of a same or different material with the first dielectric material layer 402.

Figure 13:
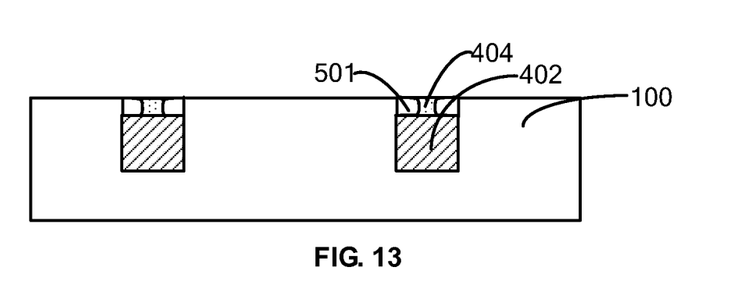

Referring to FIG. 13, a second dielectric layer 404 is formed having a top surface leveled with the top surface of the semiconductor substrate 100, e.g., by a planarization process using the semiconductor substrate 100 as a planarization stop layer to remove the mask layer 110 from the semiconductor substrate 100. A chemical mechanical polishing process can be employed to remove the mask layer 110 using the surface of semiconductor substrate 100 as the polishing stop layer to form the STI structure including the second dielectric layer 404 having a top surface leveled with the top surface of the semiconductor substrate 100.

Due to the formation of the epitaxial layer 501 on both sides of active regions on the semiconductor substrate between neighboring STI structures, the active regions between neighboring STI structures can have a width determined by a total width of a width of a portion of semiconductor substrate between neighboring STI structures and a width of the epitaxial layer 501 on the both sides. In this manner, the width of the active regions (e.g., D2 in FIG. 15) is increased by the width of the epitaxial layer 501 on both sides of the trench 301.

Figure 14:
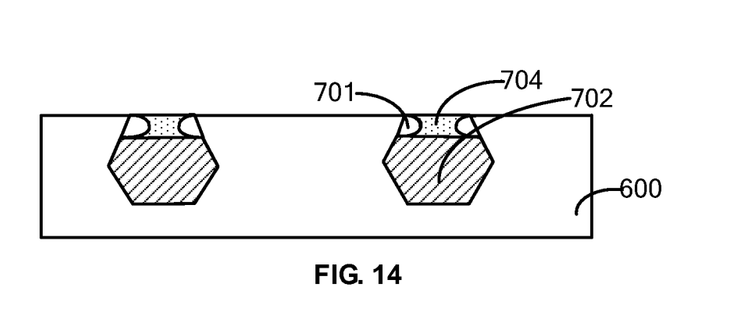

Referring to FIG. 14, in other embodiments where the STI structure is formed using the above-mentioned processes to include a Σ-shaped trench, the STI structure can include a first dielectric layer 702, a second dielectric layer 704, and an epitaxial layer 701 on the both sides of the second dielectric layer. The isolation effect between neighboring semiconductor devices can be further improved due to the wider middle section of the STI structure shown in FIG. 14.

Figure 15:
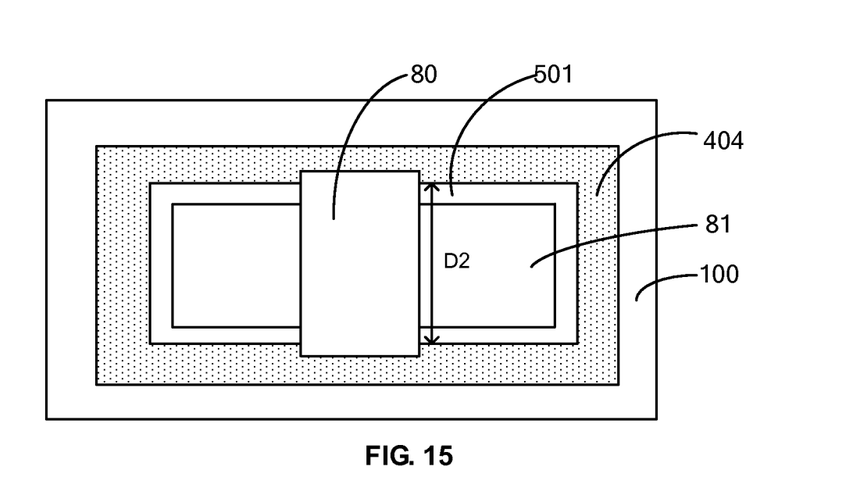
FIG. 15 depicts an exemplary semiconductor device including a transistor formed between neighboring STI structures consistent with the disclosed embodiments.

FIG. 15 shows a top view schematic of an exemplary semiconductor device including a semiconductor substrate 100 having a transistor formed between neighboring STI structures. The transistor includes a gate 80 and a source/drain 81 on the each side of the gate 80. The gate 80 is formed on surface of the epitaxial layer 501 and on surface of the semiconductor substrate 100. As shown, a channel width D2 of the transistor is a total width including the width of a portion of the semiconductor substrate located between neighboring STI structures plus the total width of the epitaxial layer on both sides of the STI structure. Compared to the conventional technology, the channel width of transistor is increased, thus to improve narrow channel effect of the transistor and to increase the drive current of the formed transistor.

In this manner, semiconductor devices including STI structures are provided herein, as depicted in FIG. 13. An exemplary semiconductor device can include an STI structure disposed in a semiconductor substrate 100. A dielectric layer is disposed in the STI structure and on the semiconductor substrate 100. The dielectric layer can include a first dielectric layer 402 and a second dielectric layer 404 on surface of the first dielectric layer 402. The second dielectric layer 404 can have a top surface leveled with a top surface of the semiconductor substrate 100. The second dielectric layer 404 can have a width smaller than a width of first dielectric layer 402. An epitaxial layer 501 can be formed on the surface of first dielectric layer 402 and connecting an end of the second dielectric layer 404. The top surface of epitaxial layer 501 can be leveled with the top surface of semiconductor substrate 100.

The width of first dielectric layer 402 ranges from about 5 nm to about 100 nm and the total thickness of first dielectric layer 402 and second dielectric layer 404 ranges from about 10 nm to about 200 nm. Both the first dielectric layer 402 and the second dielectric layer 404 are made of silicon oxide, silicon oxynitride, a high-k material, or a combination thereof.

The epitaxial layer 501 is made of a same material as the semiconductor substrate 100, and has a thickness ranging from about 5 nm to about 20 nm. In other embodiments, the epitaxial layer 501 can be doped with one or more of ions including Ge, Xe, In, or As. The doped ions can have a concentration ranging from about 5E16 atom/cm$^{-3}$ to about 5E18 atom/cm$^{-3}$. The doped ions can increase stress of active regions between neighboring STI structures and adjust the electrical resistance and band width of the epitaxial layer, thus to improve the current performance of the semiconductor devices formed on the surfaces of the active regions.

In other embodiments, the first dielectric layer can be V-shaped or Σ-shaped. FIG. 14 shows a schematic for an STI structure with a Σ-shaped first dielectric layer. The dielectric layer includes a first dielectric layer 702 and a second dielectric layer 704 on the surface of the first dielectric layer 702. The second dielectric layer 704 can have a top surface leveled with the top surface of the semiconductor substrate 600. A width of the second dielectric layer 704 is smaller than a width of the first dielectric layer 702. An epitaxial layer 701 is formed on each side/end of the second dielectric layer 704 and on the top surface of the first dielectric layer 702. The top surface of the epitaxial layer 701 is leveled with the top surface of semiconductor substrate 600.

Due to the wide middle section of the first dielectric layer 702, a distance between source/drain on one side of the STI structure and a portion of the semiconductor substrate under the STI structure can be increased to improve isolation effect between neighboring semiconductor devices.

As disclosed, a width of active region between neighboring STI structures can be increased without decreasing integration degree/level of the integration circuits. The channel width of subsequently formed transistor between neighboring STI structures can be increased to enhance the drive current and the breakdown voltage of the formed transistor.

Other applications, advantages, alternations, modifications, or equivalents to the disclosed embodiments are obvious to those skilled in the art.

What is claimed is:

1. A method of forming a transistor device, comprising:
    providing a mask layer on a semiconductor substrate;
    patterning the mask layer to form an opening in the mask layer to expose a surface portion of the semiconductor substrate;
    forming a trench in the semiconductor substrate by etching along the opening;
    forming a first dielectric layer in the trench, wherein the first dielectric layer has a top surface lower than a top surface of the semiconductor substrate to provide an uncovered sidewall surface of the trench in the semiconductor substrate;
    forming an epitaxial layer on the uncovered sidewall surface of the trench in the semiconductor substrate and on the first dielectric layer, wherein the epitaxial layer includes a spacing to expose a surface portion of the first dielectric layer; and
    forming a second dielectric layer on the exposed surface portion of the first dielectric layer to fill the spacing in the epitaxial layer, wherein:
    the first and second dielectric layers form an isolation structure for the transistor device, and
    a channel width of the transistor device is a total width including a width of a portion of the semiconductor substrate located between neighboring isolation structures plus a total width of the epitaxial layer on both sides of the isolation structure.

2. The method according to claim 1, wherein the opening in the mask layer to expose the surface portion of the semiconductor substrate has a width ranging from about 5 nm to about 200 nm.

3. The method according to claim 1, wherein the trench formed in the semiconductor substrate has a depth ranging from about 10 nm to about 200 nm.

4. The method according to claim 1, wherein the trench formed in the semiconductor substrate is U-shaped, V-shaped, or Σ-shaped.

5. The method according to claim 1, further including:
forming a Σ-shaped trench by a process including:
etching the semiconductor substrate along the opening using a dry etching process to form a first trench having vertical sidewalls, and
etching the semiconductor substrate along the first trench by a wet etching process to convert the first trench having the vertical sidewalls into the Σ-shaped trench.

6. The method according to claim 5, wherein the semiconductor substrate has a crystal plane (100).

7. The method according to claim 1, wherein the first dielectric layer has the top surface lower than the top surface of the semiconductor substrate by about 5 nm to about 20 nm, or the uncovered sidewall surface of the trench in the semiconductor substrate has a height ranging from about 5 nm to about 20 nm.

8. The method according to claim 1, wherein forming the first dielectric layer in the trench includes:
forming a dielectric material layer in the trench to completely fill the trench, and
etching back the dielectric material layer to form the first dielectric layer having the top surface of the dielectric material layer lower than the top surface of the semiconductor substrate.

9. The method according to claim 8, wherein a dry etching process or a wet etching process is used to etch back the dielectric material layer to form the first dielectric layer.

10. The method according to claim 1, wherein each of the first dielectric layer and the second dielectric layer is made of a material including silicon oxide, silicon oxynitride, or a combination thereof.

11. The method according to claim 1, wherein the first dielectric layer is made of a high-k dielectric material and the second dielectric layer is made of a high-k dielectric material.

12. The method according to claim 1, wherein the epitaxial layer is made of a same material as the semiconductor substrate.

13. The method according to claim 1, wherein the epitaxial layer is doped with ions selected from Ge, Xe, In, As, or a combination thereof.

14. The method according to claim 1, wherein forming the epitaxial layer includes a chemical vapor deposition process at a deposition temperature ranging from about 700° C. to about 800° C. for a deposition duration ranging from about 20 min to about 40 min.

15. The method according to claim 1, wherein the first dielectric layer has a width ranging from about 5 nm to about 100 nm; and the first dielectric layer and the second dielectric layer have a total thickness ranging from about 10 nm to about 200 nm.

16. The method according to claim 1, wherein the first dielectric layer is made of a high-k material and the second dielectric layer is made of a high-k material.

* * * * *